United States Patent

Brophy et al.

[11] Patent Number: 5,614,076
[45] Date of Patent: Mar. 25, 1997

[54] TOOL AND METHOD FOR ELECTROETCHING

[75] Inventors: Denis J. Brophy, Staatsburg; Madhav Datta, Yorktown Heights; Derek B. Harris, Dryden, all of N.Y.; Frank S. Ryan, Boulder, Colo.; Frank A. Spera, Poughkeepsie, N.Y.

[73] Assignee: International Business Machines Corporation, Armonk, N.Y.

[21] Appl. No.: 608,891

[22] Filed: Feb. 29, 1996

Related U.S. Application Data

[63] Continuation of Ser. No. 261,190, Jun. 17, 1994, Pat. No. 5,531,874.

[51] Int. Cl.$^6$ .................... C25F 3/02; C25F 3/14; C25F 7/00
[52] U.S. Cl. .................... 205/666; 205/670; 205/672; 205/686; 204/224 M; 204/225
[58] Field of Search .................... 204/224 M, 225; 205/670, 672, 666, 652, 686

[56] References Cited

U.S. PATENT DOCUMENTS

| | | | |
|---|---|---|---|
| 3,551,310 | 12/1970 | Inoue | 204/224 M X |
| 4,265,722 | 5/1981 | Faul et al. | 204/224 M X |
| 4,290,867 | 9/1981 | Jumer | 204/224 M X |
| 4,599,154 | 7/1986 | Bender et al. | 205/670 X |

Primary Examiner—Donald R. Valentine
Attorney, Agent, or Firm—Aziz M. Ahsan

[57] ABSTRACT

An electroetching tool using scanned localized application of flowing electrolyte against a workpiece such as a large area mask having high density features for the fabrication of microelectronic components. A masked molybdenum plate is suspended in a vertical direction within a tank which functions as a reservoir for a recirculating electrobyte. The electrolyte in the reservoir is filtered and pumped to a pair of travelling cathode assemblies from which the flowing electrolyte is simultaneously applied through respective charged orifices to both sides of the workpiece. The workpiece is masked on its opposite sides with mirror imaged mask apertures having corresponding opposite-sided features in registration with each other.

Each orifice through which the electrolyte is applied comprises an open groove in the surface of a block of polyvinal chloride material which groove extends in a vertical direction relative to the tank. The bottom of the groove is adjacent to a conductive plate. The open top of the groove is held closely against the masked plate as the cathode assembly is moved along the guide rails. The fresh electrobyte is introduced to the groove at the upper end thereof while the used electrolyte exits from the groove at the lower end thereof and into the tank reservoir for recirculation.

23 Claims, 2 Drawing Sheets

TOOL AND METHOD FOR ELECTROETCHING

CROSS-REFERENCE TO RELATED PATENT APPLICATION

This Patent Application is a continuation of U.S. patent application Ser. No. 08/261,170, filed on Jun. 17, 1994, and which issued as U.S. Pat. No. 5,531,874, on Jul. 2, 1996.

BACKGROUND OF THE INVENTION

The present invention generally relates to electroetching and, more particularly, to the electroetching of relatively large area masks having high density features for the fabrication of microelectronic components.

Chemical etching is well known in the art for making metal masks suitable for use in the fabrication of microelectronic components. Chemical etching frequently employ highly corrosive and hazardous reagents. Such processes also produce toxic wastes requiring very expensive treatment to meet the increasingly stringent environmental laws. Furthermore, the chemical etching process is slow and has limited resolution. Electroetching techniques reduce the severity of such concerns but have not been used for making metal masks.

Electroetching additionally offers better control over metal removal than does chemical etching. Compared to chemical etching which generally is isotropic, a certain degree of anisotropy can be achieved with electroetching. Due to the shadow effect of photoresist used to define the areas to be etched, there is some restriction to the direct access by the current in these locations whereby etch rates are locally reduced and a degree of anisotropic etching effect is produced. Other advantages of electroetching include high metal removal rate and the possibility of etching varieties of metals and alloys, including corrosion resistant metals, in electrolytes with minimized safety and waste disposal problems.

U.S. Pat. No. 3,962,056 issued on Jun. 8, 1976 to Shakir A. Abbas, discloses a modified electroetching process for forming holes with vertical sides in a masked monocrystalline silicon wafer. Impurities are introduced through registered mask openings on both sides of the silicon wafer. The wafer then is anodically etched through mask openings on one side of the wafer to form porous silicon regions completely through the wafer at the locations of the openings. The resultant porous silicon regions are removed with a porous silicon etchant simultaneously applied through the mask openings to both sides of the wafer.

U.S. Pat. No. 3,730,861 issued on May 1, 1973 to W. A. Haggerty teaches another electroetching technique intended to produce precisely shaped workpieces. The technique positions an electro-chemical machining tool at a preset distance from a rotating anodic workpiece while directing a stream of cathodic electrolyte against the workpiece.

Neither of the exemplary cited patents addresses the fabrication of metal masks by electroetching and the problems thereof of maintaining uniformity of current and electrolyte distribution over the workpiece, especially where the workpiece is a relatively large area mask having high density features for the fabrication of microelectronic components.

SUMMARY OF THE INVENTION

One purpose of the present invention is to provide an electroetching tool for making large area workpieces, characterized by high density features, while maintaining current and electrolyte distribution uniformity over the workpiece.

Another purpose is to provide an electroetching tool specially adapted for the fabrication of large area, high feature density masks for making microelectronic components.

A further purpose is to provide an electroetching tool for simultaneously etching opposite surfaces of a large area workpiece, characterized by high density features, while maintaining current and electrolyte distribution uniformity over the workpiece.

These and other purposes of the present invention, as will appear from a reading of the following specification, are achieved in a best mode embodiment by the provision of an electrolyte tank in which a masked molybdenum plate is suspended in a vertical direction from a fixed location. The tank functions as a recirculating electrolyte reservoir. The electrolyte in the reservoir is filtered and pumped to a travelling cathode assembly from which the flowing electrolyte is selectively applied through a charged orifice to at least one side of the workpiece. The workpiece is maintained at a positive electric voltage relative to the travelling cathode. In the best mode embodiment, the molybdenum plate is masked on its opposite sides with mirror imaged mask appertures having corresponding features in registration with each other. A pair of registered cathode assemblies are caused to travel between guide rails straddeling the tank so that flowing electrolyte is applied simultaneously to registered opposite locations on the opposite-sided masked plate.

BEST MODE FOR CARRYING OUT THE INVENTION

Figure 1:
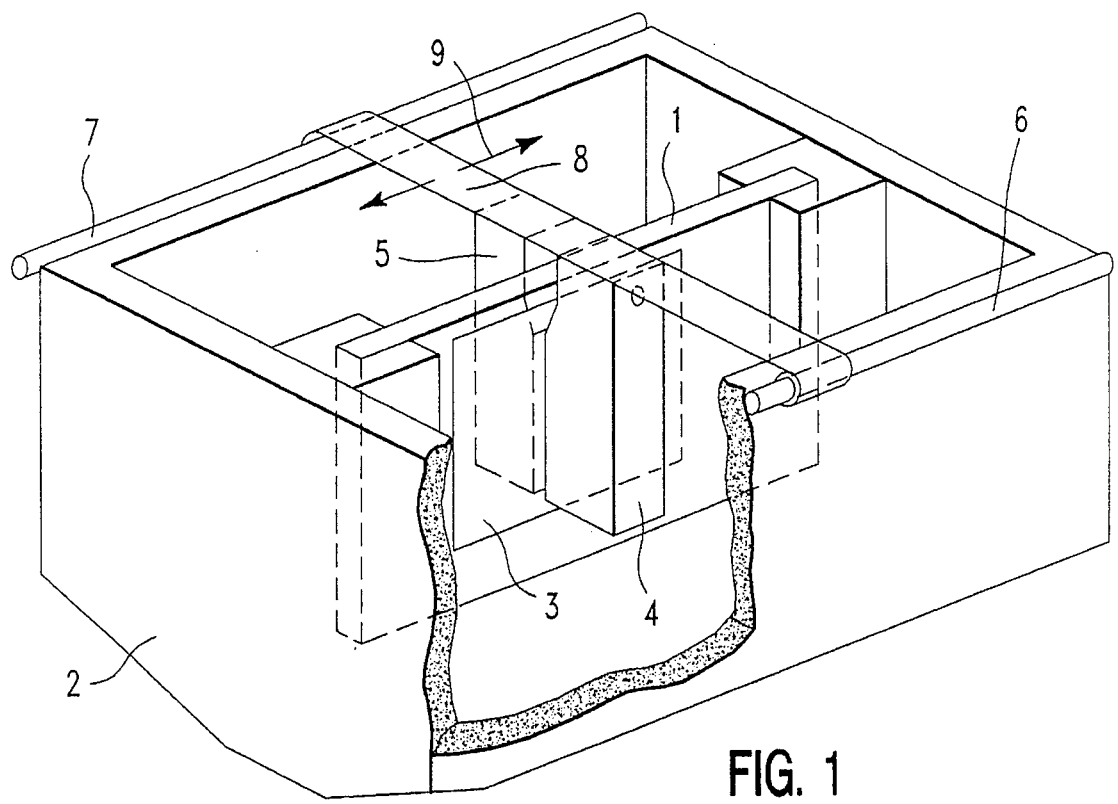
FIG. 1 is a simplified perspective view of the structural elements of the best mode embodiment of the present invention.

The electroetching tool of the present invention utilizes a technique of the localized dissolution of a masked workpiece by flowing electrolyte from the charged orifice of a moving cathode which is scanned across the face of the workpiece. Referring to FIG. 1, a workpiece or mask holder 1 is fixed to the sidewalls of electrolyte reservoir tank 2. A masked molybdenum plate 3 is inserted in holder 1. Both sides of plate 3 are covered by a resist mask for delineating features where holes of desired shape and size are desired to be placed in plate 3. The two resist masks are mirror images of each other with corresponding features in registered relationship on opposite sides of plate 3.

Two movable cathode assemblies 4 and 5 are mounted on guide rails 6 and 7 via transverse support member 8 which is drivable as shown by the double headed arrow 9 so as to scan assemblies 4 and 5 in synchronous unison across the respectively opposing surfaces of workpiece 3. Each cathode assembly comprises a narrow charged orifice extending in a vertical direction relative to tank 2 so that flowing electrolyte is applied in the presence of an electric field simultaneously to registered opposite locations on the double sided masked plate 3. The assembly is shown in more detail in FIG. 2.

Figure 2:
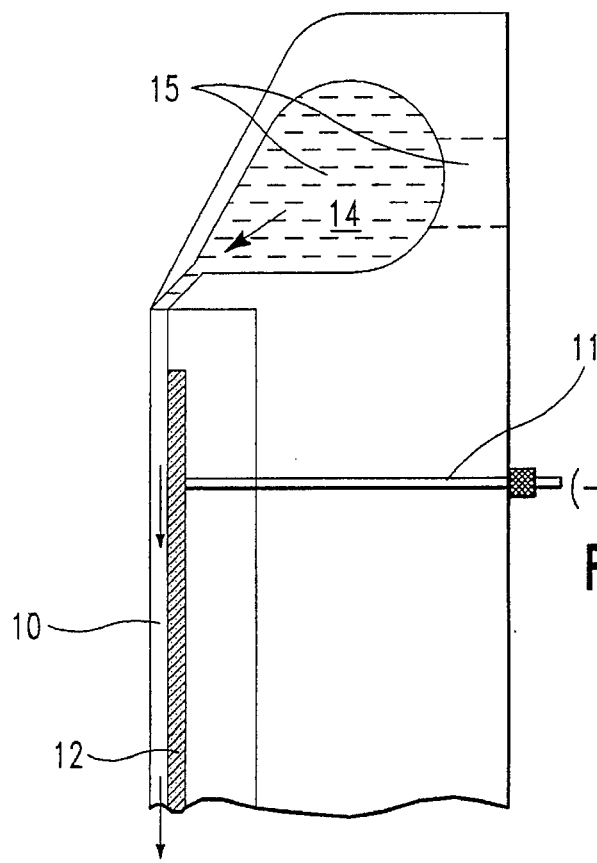
FIG. 2 is a cross-sectional view of one of the travelling cathode assemblies of FIG. 1.

As shown in FIG. 2, the orifice is in the form of a groove 10 cut into the face of polyvinyl chloride block 11. Embedded adjacent a surface of block 11 is an electrically conducting plate 12 to which a voltage potential is applied via electrodes 4 and/or 5. Flowing electrolyte 14 enters the upper end of groove 10 from ducts 15 and exits from the lower end of groove 10 into the reservoir tank 2 of FIG. 1. Electrolyte 14 is substantially confined to flow within groove 10 and against the face of workpiece 3 of FIG. 1 by the close presence of workpiece 3 across whose masked face the open side of groove 10 is placed flush and is closely scanned. A precision linear motion unit (not shown) is used to move the cathodes over the workpiece at a preset speed.

Figure 3:
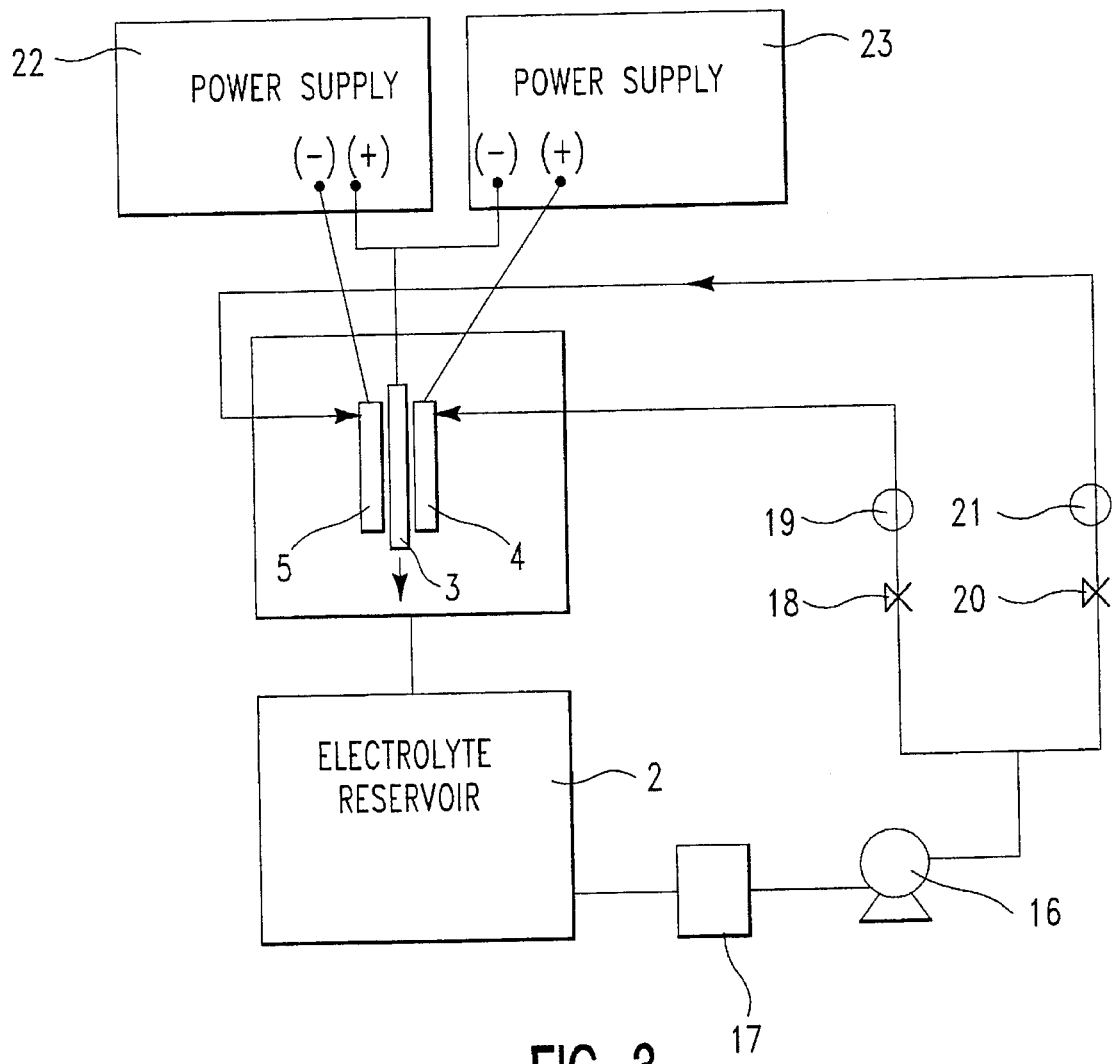
FIG. 3 is a block diagram representing the electrolyte circulation apparatus and the electrical potential sources associated with the embodiment of FIG. 1.

FIG. 3 is a block diagram of the entire apparatus of the present invention incorporating the components of FIGS. 1 and 2. FIG. 3 further represents the electrolyte recirculation system and the manner in which electric potentials are applied to both of the cathode assemblies relative to the anodic workpiece. The electrolyte 14 is stored in reservoir 2, is pumped (16) through filter 17 and is distributed to the two cathode assemblies via valve 18, flow monitor 19 and via valve 20, flow monitor 21, respectively. The workpiece 3 is connected to the positive poles of power supplies 22 and 23. The negative poles of supplies 22 and 23 are connected to cathodes 5 and 4, respectively. Two separate power supplies 22 and 23 are employed for better control of the charges applied between cathodes 5 and 4 and the workpiece 3. Power supplies 22 and 23 preferably include integrators and have the capability to preset the amount of charge expended during etching.

Cathode plate 12 is fixed on block 11 at a distance from the entrance of electrolyte 14 into groove 10. This distance, known as the entrance length, in principle should be approximately 50 times the hydraulic diameter of the channel in order to provide fully developed velocity profiles at the active surface of the electrodes. Some baffle provision (not shown) can be placed in the electrolyte entrance to help compensate for the effect.

The cathode groove dimensions and the electrolyte flow are important parameters obtaining uniform current distribution across the workpiece. The cathode length should be slightly larger than the active length of the workpiece. The electrolyte flow is determined by the hydraulic diameter of the groove 10 which for a given length is established by the groove width and the spacing between the workpiece 3 and the cathodes 4 and 5. In order to localize the dissolution of the workpiece and to obtain high current density, a very narrow, groove 10 is used, e.g., of the order of about 0.25 inches to about 0.50 inches. A very small spacing of about 2–3 mm between assemblies 4 and 5 and workpiece 3 provides the attainment of high flow rate and improved directionality of flow.

Figure 4:
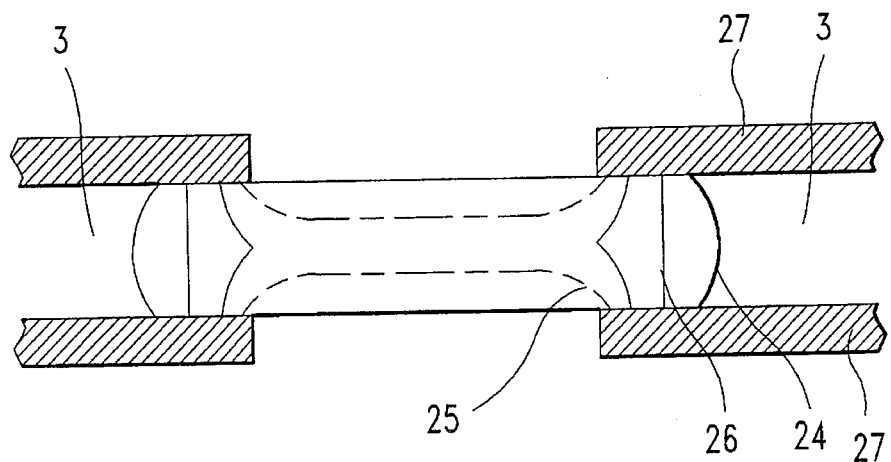
FIG. 4 is a cross-sectional view of one etched hole in a doubly-masked workpiece produced by the embodiment of FIG. 1, as a function of the applied electric voltage.

FIG. 4 demonstrates the relationship of the sidewall shape of the through-holes resulting from two-sided electroetching as a function of the electric voltage applied between cathodes 4 and 5 and workpiece 3. Such differing sidewall shapes may be required, depending on the nature of the features to be etched into the mask 3 for example by utilizing photoresist 27. For example, molybdenum masks for screening purposes require that the walls of the holes be straight as at 24 of FIG. 4. Knife-edged vias as represented by the numeral 25 would be more suitable if the finished mask 3 were to be used as a C4 (ball joint) evaporation mask. The differing sidewall shapes shown in FIG. 4 are achieved by controlling the amount of etching, as by controlling the amount of applied electric voltage. Increasing the potential incrementally produces the shape sequence denoted by 25, 24, 26. It should be noted, however, that the fabrication of features having differing pattern sizes and densities require that the current distribution be extremely uniform over the entire workpiece in order to achieve shape uniformity. Such uniform current distribution is provided by the electroetching tool of the present invention by the technique of using the small scanning charged orifice of the described cathode(s) and integration of its effect across the entire face of the workpiece.

What is claimed:

1. An electroetching tool for localized etching of a masked workpiece plate, comprising, tank adapted to contain electrolyte, means for holding said masked workpiece plate being adapted for fixed position in a vertical direction within said tank, at least one cathode assembly having a narrow orifice extending in said vertical direction within said tank, means for causing said electrolyte to flow from said tank and through said narrow orifice to impinge upon said masked workpiece plate, means for scanning said cathode assembly so that said narrow orifice is moved in a direction perpendicular to said vertical direction across the face of said masked workpiece plate, and means for applying an electric voltage across said masked workpiece plate and said cathode assembly, so as to cause localized etching in said masked workpiece plate, and thereby forming said electroetching tool.

2. The electroetching tool of claim 1, further includes a pair of cathode assemblies, said pair of cathode assemblies being scanned in unison across opposite faces of said masked workpiece plate.

3. The electroetching tool of claim 1, wherein said masked workpiece plate is masked in a mirror image fashion, so that corresponding features are in registered relationship on opposite sides of said masked workpiece plate.

4. An electroetching tool for localized electroetching comprising, a tank adapted to contain electrolyte, means for holding a masked workpiece plate to be etched, said masked workpiece plate adapted for fixed position in a vertical direction within said tank, at least one cathode assembly having a narrow orifice extending in said vertical direction within said tank, means for causing said electrolyte to flow from said tank and through said narrow orifice to impinge upon said masked workpiece plate, means for scanning said cathode assembly so that said narrow orifice is moved in a direction perpendicular to said vertical direction across the face of said masked workpiece plate, and means for applying an electric potential across said masked workpiece plate and said cathode assembly, so as to cause localized electroetching in said masked workpiece plate, said cathode assembly being negatively energized relative to said masked workpiece plate, and wherein uniformity of current distribution across the face of said masked workpiece plate is achieved by the integrated effect of scanning said narrow orifice of each of said cathode assembly across the face of said masked workpiece plate, and thereby forming said electroetching tool.

5. The electroetching tool defined in claim 4 wherein
said orifice comprises a vertically extending groove on the surface of said assembly facing said plate,
said assembly being closely scanned across the facing surface of said plate,
said electrolyte being caused to flow from the upper end of said groove to the lower end thereof.

6. The electroetching tool defined in claim 5 and further including an electrically conductive plate adjacent the bottom of said groove,
said electric potential being applied to said conductive plate so as to make said conductive plate negative relative to said workpiece plate.

7. The electroetching tool defined in claim 6 wherein
said conductive plate is fixed adjacent the surface of a block of insulating material.

8. The electroetching tool of claim 5 wherein the spacing between said groove and said facing surface of said plate is from about 2 mm to about 3 mm.

9. The electroetching tool of claim 5, wherein the width of said groove is from about 0.25 inches to about 0.50 inches.

10. The electroetching tool defined in claim 4 and including
a pair of cathode assemblies, said pair of assemblies being scanned in unison across opposite faces of said plate,
said plate being masked in mirror image fashion whereby corresponding features are in registered relationship on opposite sides of said plate.

11. The electroetching tool of claim 1, wherein said narrow orifice comprises a vertically extending groove on the surface of said cathode assembly when facing said masked workpiece plate,
said cathode assembly being adapted to closely scan across the facing surface of said masked workpiece plate, and
wherein said electrolyte is caused to flow from the upper end of said groove to the lower end thereof.

12. The electroetching tool of claim 11, wherein the spacing between said groove and said facing surface of said masked workpiece plate is from about 2 mm to about 3 mm.

13. The electroetching tool of claim 11, wherein the width of said groove is from about 0.25 inches to about 0.50 inches.

14. The electroetching tool of claim 11, further includes an electrically conductive plate adjacent the bottom of said groove, and
wherein electric potential is applied to said conductive plate so as to make said conductive plate negative relative to said masked workpiece plate.

15. The electroetching tool of claim 14, wherein said conductive plate is fixed adjacent the surface of a block of an insulating material.

16. A method for electroetching a masked workpiece, said method comprising the steps of:
(a) fixing said masked workpiece to a portion of a sidewall of an electrolyte reservoir tank,
(b) mounting two movable cathode assemblies on guide rails via at least one transverse support member to said electrolyte reservoir tank,
(c) driving means for driving said two movable cathode assemblies in synchronous unison motion across respective opposing surfaces of said masked workpiece, and
(d) upon flowing electrolyte simultaneously applying an electrical field through said two movable cathode assemblies, and thereby electroetching said masked workpiece.

17. The electroetching method of claim 16, wherein each cathode assembly comprises a charged orifice extending in a vertical direction relative to said electrolyte reservoir tank, which is used during said method of electroetching.

18. The electroetching method of claim 17, wherein said charged orifice comprises a vertically extending groove on the surface of said cathode assembly when facing said masked workpiece, and
wherein said method comprises the steps of causing said electrolyte to flow from the upper end of said groove to the lower end thereof.

19. The electroetching method of claim 18, wherein the spacing between said groove and said facing surface of said masked workpiece is from about 2 mm to about 3 mm, during said method of electroetching.

20. The electroetching method of claim 18, wherein the width of said groove is from about 0.25 inches to about 0.50 inches prior to step (b).

21. The electroetching method of claim 18, further includes an electrically conductive plate adjacent the bottom of said groove, and
wherein electric potential is applied to said conductive plate so as to make said conductive plate negative relative to said masked workpiece during said method of electroetching.

22. The electroetching method of claim 21, wherein said conductive plate is fixed adjacent the surface of a block of an insulating material prior to step (d).

23. The electroetching method of claim 16, wherein said masked workpiece is masked in a mirror image fashion, so that corresponding features are in registered relationship on opposite sides of said masked workpiece during said method of electroetching.

* * * * *